(12) United States Patent
Lee

(10) Patent No.: US 7,618,860 B2
(45) Date of Patent: Nov. 17, 2009

(54) METHOD FOR FABRICATING SEMICONDUCTOR DEVICE

(75) Inventor: Hong-Gu Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 343 days.

(21) Appl. No.: 11/648,322

(22) Filed: Dec. 28, 2006

(65) Prior Publication Data

US 2008/0003800 A1    Jan. 3, 2008

(30) Foreign Application Priority Data

Jun. 29, 2006    (KR) ...................... 10-2006-0059738

(51) Int. Cl.
*H01L 21/00*    (2006.01)
(52) U.S. Cl. ..................... 438/253; 438/638
(58) Field of Classification Search ......... 438/238–256, 438/637–640
See application file for complete search history.

(56) References Cited

U.S. PATENT DOCUMENTS

2005/0073053 A1*    4/2005    Park ........................... 257/774

FOREIGN PATENT DOCUMENTS

| KR | 10-2004-0000068 | 1/2004 |
|---|---|---|
| KR | 10-2004-0011993 | 2/2004 |
| KR | 10-0558036 | 2/2006 |
| KR | 10-0587636 | 5/2006 |

* cited by examiner

*Primary Examiner*—Richard A. Booth
(74) *Attorney, Agent, or Firm*—Blakely Sokoloff Taylor & Zafman

(57) ABSTRACT

A method for fabricating a semiconductor device includes forming a first insulating layer over a substrate where a landing contact plug is formed, forming an etch barrier pattern having a line type open region over the first insulating layer, forming a second insulating layer for planarization over the etch barrier pattern, forming a contact mask having a hole type open region over the second insulating layer, performing a self-aligned contact etching process using the etch barrier pattern to etch the second insulating layer disposed under the hole type open region and the first insulating layer disposed under the line type open region to form a contact hole a bottom of which is opened above the landing contact plug, forming a storage node contact plug in the contact hole, and forming a storage node over the storage node contact plug.

16 Claims, 9 Drawing Sheets

METHOD FOR FABRICATING SEMICONDUCTOR DEVICE

CROSS-REFERENCE TO RELATED APPLICATIONS

The present invention claims priority of Korean patent application number 10-2006-0059738, filed on Jun. 29, 2006, which is incorporated by reference in its entirety.

BACKGROUND OF THE INVENTION

The present invention relates to a fabrication method of a semiconductor device, and more particularly, to a method for fabricating a semiconductor method, which can accurately overlap a storage node contact plug with a storage node.

In dynamic random access memory (DRAM), a storage node (SN) must be designed to have a maximum area in order to secure a capacitance of a capacitor. The storage node (SN) must be arranged in a zigzag form in order to obtain a maximum area within a limited cell area. The zigzag arrangement, however, causes a misalignment of the storage node (SN) and a storage node contact (SNC) disposed thereunder. To solve the misalignment, another storage node contact (SNC2) is formed between the storage node (SN) and the storage node contact (SNC) to connect them to each other.

FIG. 1 illustrates a typical method for forming a storage node. A plurality of gate patterns 12 are formed over a substrate 11 where a device isolation structure is formed. Gate spacers 13 are formed on sidewalls of the gate patterns 12.

A landing plug contact 14 is formed between the gate patterns 12. A first insulating layer 15 and a second insulating layer 16 are sequentially formed over the resulting structure. The second insulating layer 16 and the first insulating layer 15 are etched to form a storage node contact hole (not indicated by a reference numeral). Thereafter, the storage node contact hole is filled to form a storage node contact (SNC) plug 17.

A third insulating layer 18 is formed over the resulting structure with the SNC plug 17. Another storage node contact (SNC2) plug 19 is formed in the third insulating layer 18. The SNC2 plug 19 passes through the third insulating layer 18 and is connected to the SNC plug 17. In forming the SNC2 plug 19, an SNC2 mask is required. The third insulating layer 18 is etched using the SNC2 mask as an etch barrier to thereby form an SNC2 contact hole. Then, the SNC2 contact hole is filled to form the SNC2 plug 19. The processes of forming the SNC2 mask, the SNC2 contact hole, and the SNC2 plug will be referred to as an SNC2 process. A fourth insulating layer 20 is formed over the SNC2 plug 19 and is then etched to form a hole. The hole is filled to form a storage node 21. In the typical method shown in FIG. 1, the SNC2 plug 19 is formed between the SNC plug 17 and the storage node 21 to connect them to each other in the middle of the misaligned structure.

FIG. 2 illustrates a layout diagram of a typical connection relationship of SNC plugs, storage nodes, and SNC2 plugs. According to the typical method of FIG. 1, however, the SNC2 process requires additional processes, including the SNC2 mask process (using ArF), which is a threshold layer mask step. Consequently, the SNC2 process leads to increase in a turn around time (TAT) and a manufacturing cost. Moreover, an unnecessary interface is formed between the SNC plug 17 and the SNC2 plug 19, increasing a contact resistance.

SUMMARY OF THE INVENTION

Embodiments of the present invention are directed to provide a method for fabricating a semiconductor device, which can accurately overlap a storage node contact plug and a storage node without any additional SNC2 process and can prevent increase of a contact resistance.

In accordance with an aspect of the present invention, there is provided a method for fabricating a semiconductor device, including: forming a first insulating layer over a substrate where a landing contact plug is formed; forming an etch barrier pattern having a line type open region over the first insulating layer; forming a second insulating layer for planarization over the etch barrier pattern; forming a contact mask having a hole type open region over the second insulating layer; performing a self-aligned contact etching process using the etch barrier pattern to etch the second insulating layer disposed under the hole type open region and the first insulating layer disposed under the line type open region to form a contact hole a bottom of which is opened above the landing contact plug; forming a storage node contact plug in the contact hole; and forming a storage node over the storage node contact plug.

DESCRIPTION OF SPECIFIC EMBODIMENTS

FIGS. 3A to 3F illustrate cross-sectional views of a method for fabricating a semiconductor device in accordance with an embodiment of the present invention.

Figure 1:
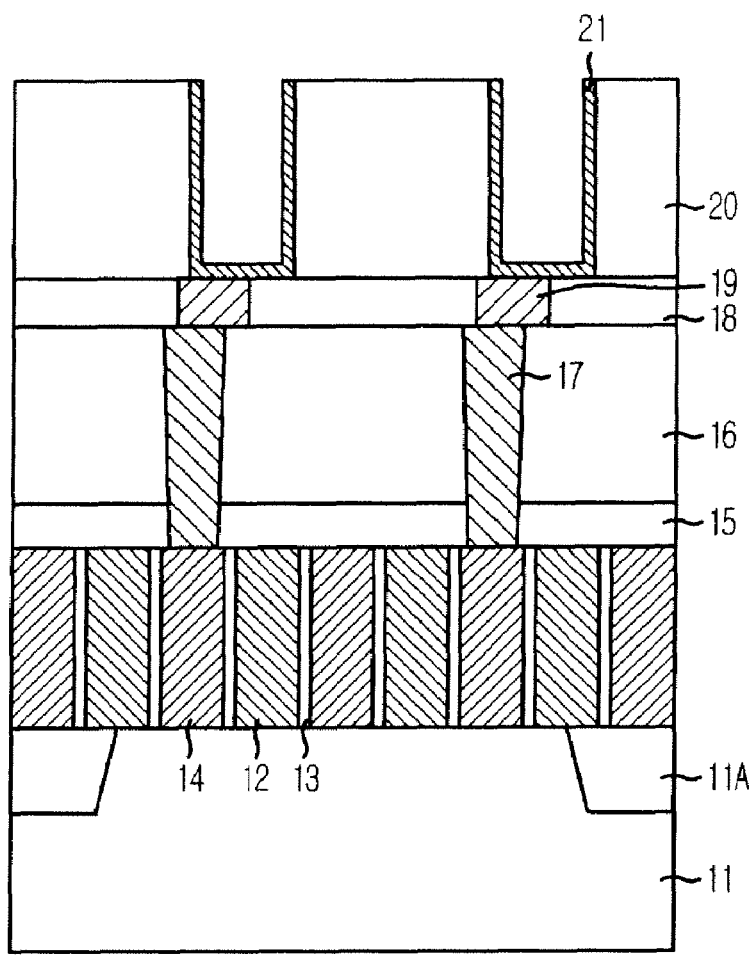
FIG. 1 illustrates a cross-sectional view showing a typical method for forming a storage node.
Figure 2:
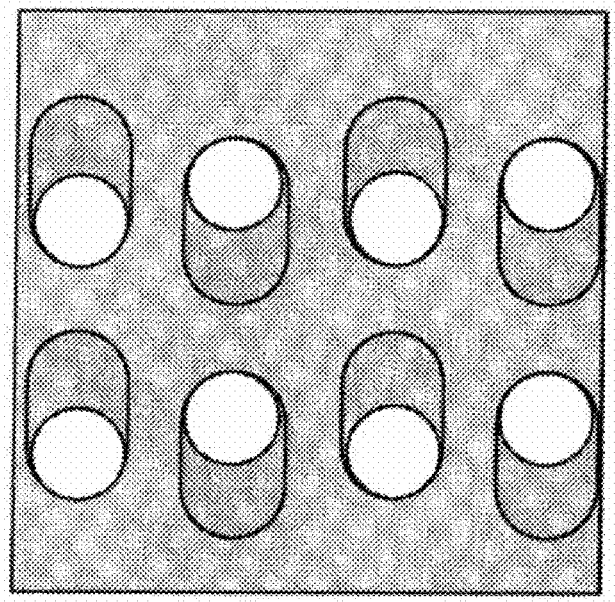
FIG. 2 illustrates a layout diagram of a typical connection relationship of an SNC plug, a storage node, and an SNC2 plug.
Figure 3A:
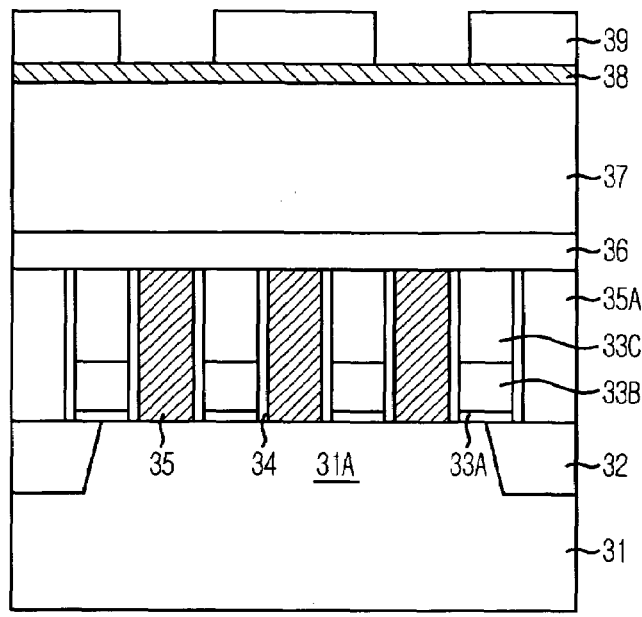
FIGS. 3A to 3F illustrate cross-sectional views of a method for fabricating a semiconductor device in accordance with an embodiment of the present invention.

Referring to FIG. 3A, a device isolation structure 32 is formed in a substrate 31 to define an active region 31A and a plurality of gate patterns are then formed over the substrate 31. Each of the gate patterns includes a gate dielectric layer 33A, a gate electrode 33B, and a gate hard mask nitride layer 33C, which are staked in this order. Gate spacers 34 are formed on sidewalls of the gate patterns. The gate spacers 34 are formed of silicon nitride.

Landing contact plugs 35 are formed between the gate patterns. Although there are a plurality of landing contact plugs 35 shown in the drawings, a single landing contact plug 35 is described herein for convenience. In the forming of the landing contact plug 35, a first insulating layer 35A is deposited and etched to form a contact hole to open a region defined between the gate patterns. Then, the contact hole is filled with polysilicon and an etch-back process or a chemical mechanical polishing (CMP) process is performed to form the landing contact plug 35.

A second insulating layer 36 and a third insulating layer 37 are deposited over the resulting structure with the landing contact plug 35. Although not shown in FIG. 3A, after forming the second insulating layer 36, a bit line process is performed to connect a bit line to a portion of the landing contact plug 35. The second and third insulating layers 36 and 37 are formed of silicon oxide, e.g., $SiO_2$.

A barrier nitride layer 38 is formed over the third insulating layer 37 and a line type mask 39 is then formed over the barrier nitride layer 38. The barrier nitride layer 38 is defined to open a bottom of a storage node contact hole only over the landing contact plug 35 and block the remaining region from being etched during a following process of etching the storage node contact.

The barrier nitride layer 38 has a dense structure and is formed of thermal nitride, e.g., silicon nitride ($Si_3N_4$), which has a good etch selectivity with respect to the silicon oxide layer. Also, the barrier nitride layer 38 is formed to a thickness ranging from approximately 300 Å to approximately 500 Å, so that the barrier nitride layer 38 can sufficiently act as an etch barrier during the process of etching the storage node contact and minimize the occurrence of a step after the barrier nitride layer 38 is patterned.

The line type mask 39 is a photoresist mask for patterning the barrier nitride layer 38. Only the barrier nitride layer 38 formed over the second and third insulating layers 36 and 37 is etched using the line type mask 39. Because the barrier nitride layer 38 has a relatively small thickness ranging from approximately 300 Å to approximately 500 Å, there is no burden on the thickness of the photoresist mask. In addition, because the mask 39 has a large-sized simple line pattern, there is no burden on a photo patterning. Therefore, the mask 39 is a non-critical layer in which a critical dimension (CD) can be freely adjusted. Because the barrier nitride layer is patterned using the line type mask 39 and the patterned barrier nitride layer affects the storage node contact hole, the line type mask 39 will be referred to as an L-SNC mask (a line type SNC mask) 39.

Figure 3B:
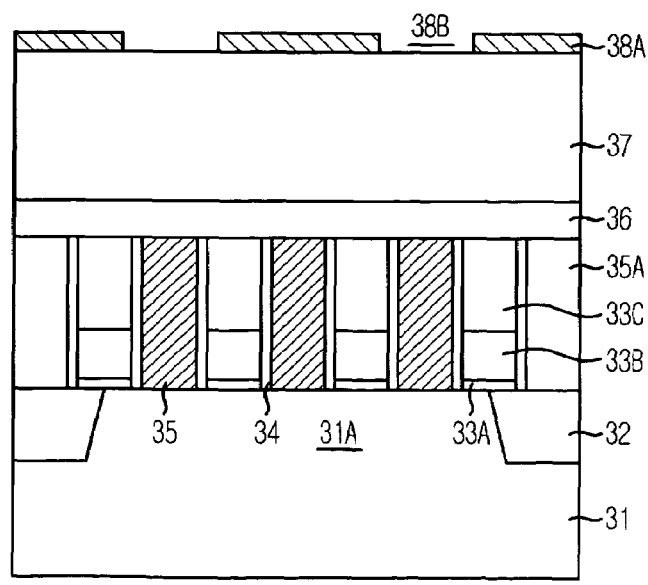

Referring to FIG. 3B, a barrier nitride pattern 38A is formed by etching the barrier nitride layer 38 using the L-SNC mask 39 as an etch barrier. Then, the L-SNC mask 39 is stripped. The barrier nitride pattern 38A defines a first open region 38B opening a region where a storage node contact hole will be formed.

The etching process of forming the barrier nitride pattern 38A is to etch only the barrier nitride layer 38 using the L-SNC mask 39. Therefore, in the etching process, the etching target is optimized such that the third insulating layer 37 is lost as little as possible, considering the step that may be formed during the following process.

A final inspection critical dimension (FICD) of the barrier nitride pattern 38A affects a bottom FICD of the storage node contact hole, which will be formed later. Therefore, if necessary, the FICD can be adjusted by controlling a slope of an etch section in an etching recipe.

Figure 3C:
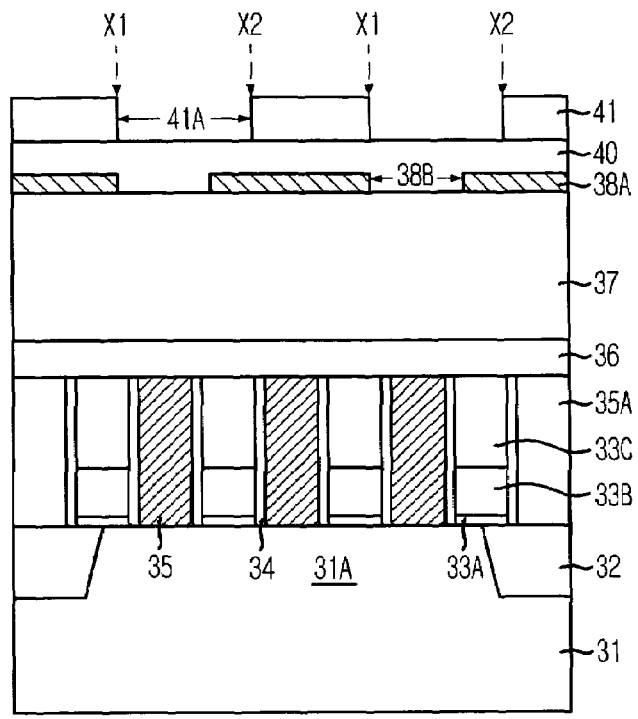

Referring to FIG. 3C, a fourth insulating layer 40 is formed over the resulting structure with the barrier nitride pattern 38A. Like the second and third insulating layers 36 and 37, the fourth insulating layer 40 is formed of silicon oxide, e.g., $SiO_2$. The fourth insulating layer 40 is deposited over the barrier nitride pattern 38A until the first open region 38B of the barrier nitride pattern 38A is filled.

The fourth insulating layer 40 is formed for planarization to make it easy to perform a patterning process during the SNC mask process for etching a following storage node contact. That is, the fourth insulating layer 40 is deposited to a thickness enough to overcome the step caused by the barrier nitride pattern 38A. For example, the fourth insulating layer 40 is formed to a thickness ranging from approximately 1,000 Å to approximately 1,500 Å. If necessary, an etch-back process may be further performed immediately after depositing the fourth insulating layer 40. The fourth insulating layer 40 may be formed of borophosphosilicate glass (BPSG) or spin on dielectric (SOD), which is advantageous to a gap filling and thus has a good planarization characteristic. In addition, the fourth insulating layer 40 may be annealed in order to further improve the planarization characteristic.

A hole type SNC (H-SNC) mask 41 using a photoresist is formed over the fourth insulating layer 40. The H-SNC mask 41 is a mask defining a storage node contact hole where the storage node contact will be formed. Specifically, the H-SNC mask 41 provides a second open region 41A having a given area to define a CD of the storage node contact hole. The second open region 41A has a rectangular hole structure with a major axis and a minor axis. In the major axis direction, one side X1 of the second open region 41A is aligned along one side of the barrier nitride pattern 38A and another side X2 of the second open region 41A is partially overlapped with the barrier nitride pattern 38A.

While the second open region 41A defined by the H-SNC mask 41 is a hole type open region, the first open region 38B defined by the barrier nitride pattern 38A is a line type open region. A CD of the second open region 41A in the major axis is greater than that of the first open region 38B in the minor axis direction.

More specifically, the second open region 41A defined by the H-SNC mask 41 is arranged in the same layout as the storage node in order to secure an overlap margin with the storage node that will be formed later. This will be described later with reference to FIG. 4C. The reason why such an arrangement is possible is that the barrier nitride pattern 38A acts as a screen such that the barrier nitride pattern 38A defines a bottom of the storage node contact only over the landing contact plug 35 during a following process of etching the storage node contact. Therefore, the H-SNC mask 41 is patterned to open a portion of the barrier nitride pattern 38A disposed thereunder.

Figure 3D:
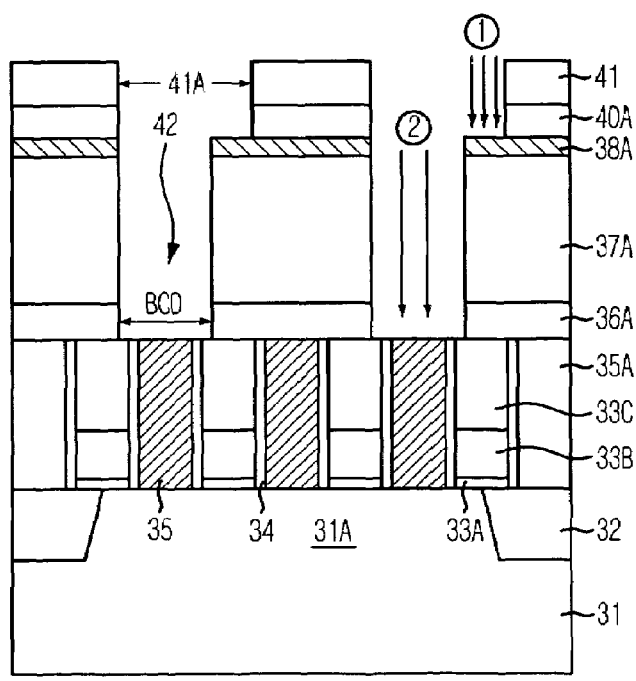

Referring to FIG. 3D, the layers exposed under the second open region 41A are etched using the H-SNC mask 41 as an etch barrier to thereby form a storage node contact hole 42 opening a surface of the landing contact plug 35. As indicated by a reference number ①, the process of etching the storage node contact for forming the storage node contact hole is performed to etch the fourth insulating layer 40 disposed under the second open region 41A, forming a patterned fourth insulating layer 40A. At this point, the etching is stopped at the surface of the barrier nitride pattern 38A. Thereafter, as indicated by a reference numeral ②, the second and third insulating layers 36 and 37 disposed under the first open region 38B are etched using the barrier nitride pattern 38A as an etch barrier to thereby expose the surface of the landing contact plug 35. Reference denotations 36A and 37A represent a patterned second insulating layer and a patterned third insulating layer, respectively.

Because the etching process is affected by the barrier nitride pattern 38A, a self-aligned contact etching process mechanism results. That is, although the second open region 41A is opened with a large area because of the H-SNC mask 41, a bottom critical dimension, as denoted with reference denotation BCD, of the finally opened storage node contact hole 42 becomes smaller. This can be achieved by the presence of the barrier nitride pattern 38A. The etching process using this principle is called a self-aligned contact (SAC) etching process.

Therefore, the etching recipe employs an SAC chemistry that well etches selectively the silicon oxide layer used for the second to fourth insulating layers 36, 37 and 40, while not well etching the silicon nitride layer used for the barrier nitride pattern 38A. For example, the SAC chemistry uses at least one gas selected from the group consisting of $C_5F_8$, $C_4F_8$, $C_4F_6$, $CH_2F_2$, and combinations thereof. The use of these gases leads to a polymer rich gas. Therefore, only the silicon oxide layer can be selectively etched.

More specifically, when the fourth insulating layer 40 is etched to expose the barrier nitride pattern 38A, the fourth insulating layer 40, the third insulating layer 37, and the second insulating layer 36, which are disposed in the region where there is no barrier nitride pattern 38A, are continuously etched. However, the layers disposed under the barrier nitride pattern 38A are not etched any more because the barrier nitride pattern 38A has a high etch selectivity due to the etching chemistry. Consequently, due to the barrier nitride pattern 38A, the bottom of the storage node contact hole 42 is defined only over the landing contact plug 35.

As another method for forming the storage node contact hole 42 opening the surface of the landing contact plug 35 by etching the layers exposed under the second open region 41A using the H-SNC mask 41 as an etch barrier, a wet etch process may be used to etch the silicon oxide layer in a lateral direction in order to increase a top CD and the bottom CD of the storage node contact hole 42. Because the barrier nitride pattern 38A acts as an etch barrier during the wet etching process, the bottom CD of the storage node contact hole 42 is small. The silicon oxide layer is selectively dry-etched using a buffered oxide etchant (BOE), and a BOE concentration and a dip time are adjusted in order to control a wet etch rate. Compared with the dry etching process, the wet etching process can further increase the top CD and the bottom CD of the storage node contact hole 42. Therefore, the overlap margin between the storage node contact plug and the storage node can be further increased.

Figure 3E:
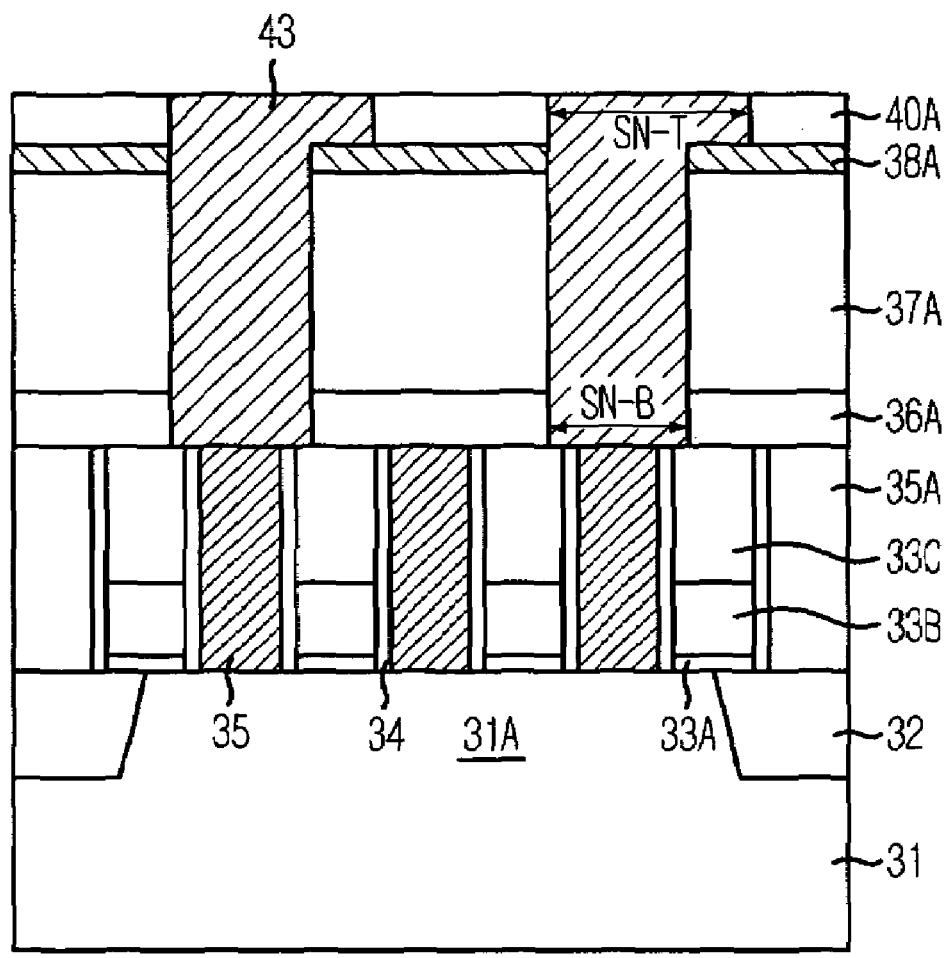

Referring to FIG. 3E, the H-SNC mask 41 is removed and polysilicon is then deposited over the resulting structure until the storage node contact hole 42 (refer to FIG. 3D) is filled. Then, a storage node contact plug 43 is formed by etching back the polysilicon until the surface of the patterned fourth insulating layer 40A is exposed. A bottom SN-B of the storage node contact plug 43 is connected only over the landing contact plug 35, and a top SN-T of the storage node contact plug 43 has the same area as the storage node and is connected thereto.

More specifically, in the storage node contact plug 43, the top (SN-T) CD is greater than the bottom (SN-B) CD. That is, because the storage node contact plug 43 has a "T" shape, the top area contacting the storage node is large, while the bottom area contacting the landing contact plug 35 is small. Because the top area of the storage node contact plug 43 is large, the storage node is sufficiently overlapped, thereby securing the overlap margin.

Figure 3F:
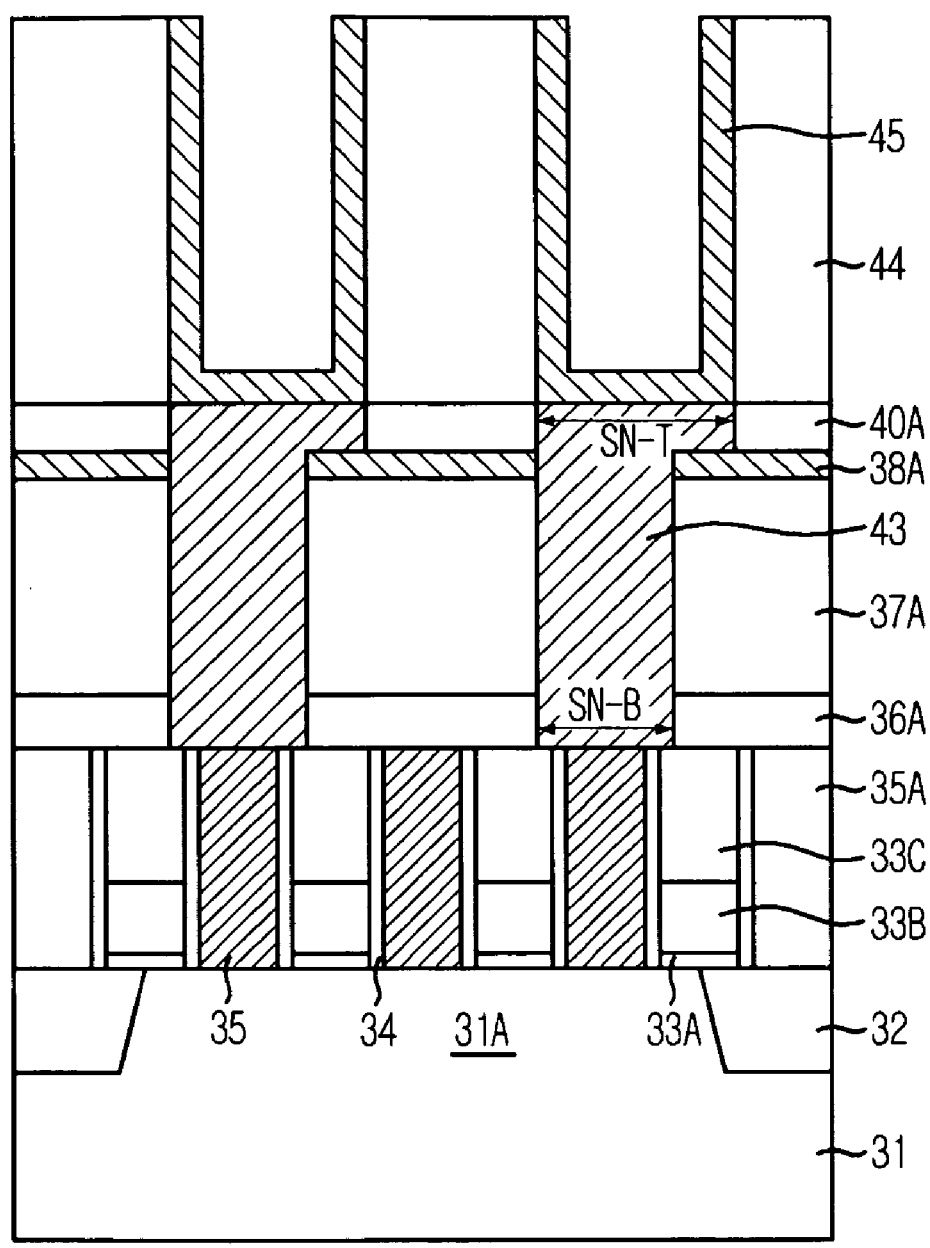

Referring to FIG. 3F, a fifth insulating layer 44 is formed over the resulting structure, and the fifth insulating layer 44 is etched using the SN mask to thereby form a hole (not indicated by a reference numeral) where the storage node will be formed. Thereafter, a conductive layer is deposited to form a storage node 45 connected to the storage node contact plug 43. The storage node 45 has the same layout as the second open region 41A defined by the SNC mask 41 of FIG. 4C. The storage node 45 may have a concave structure. If the fifth insulating layer 44 is removed, the storage node 45 has a cylinder structure.

Therefore, it is possible to secure the sufficient overlap margin with the top of the storage node contact plug 43 contacting the storage node 45. In order for the bottom of the storage node 45 and the top of the storage node contact plug 43 to have the maximum overlap, the storage node 45 and the storage node contact plug 43 are arranged in the same zigzag form (see FIG. 4C). As described above, the SNC process and the SNC2 process can be combined as a single process by forming the storage node contact plug 43 having the wide top area, thereby simplifying the fabricating process.

Figure 4A:
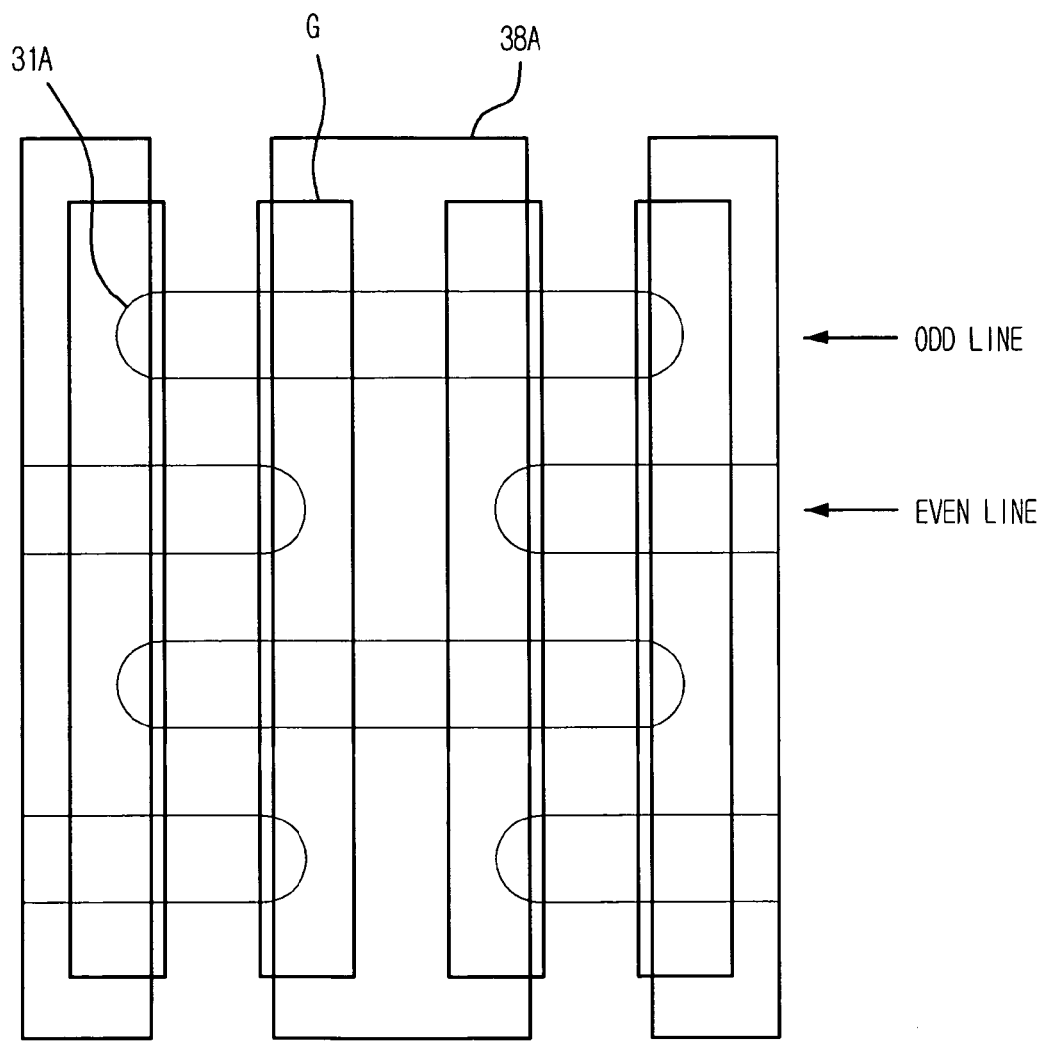
FIGS. 4A to 4C illustrate layout diagrams of a semiconductor device in accordance with an embodiment of the present invention.
Figure 4B:
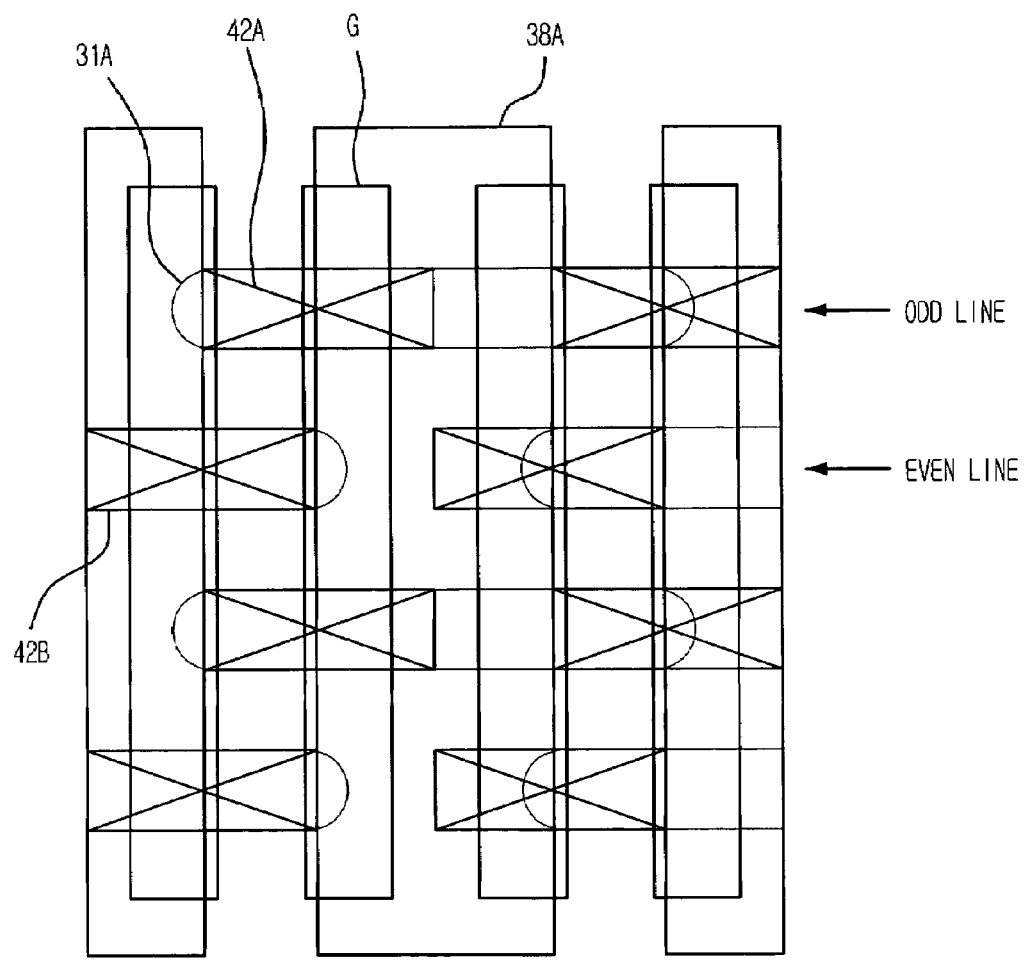
Figure 4C:
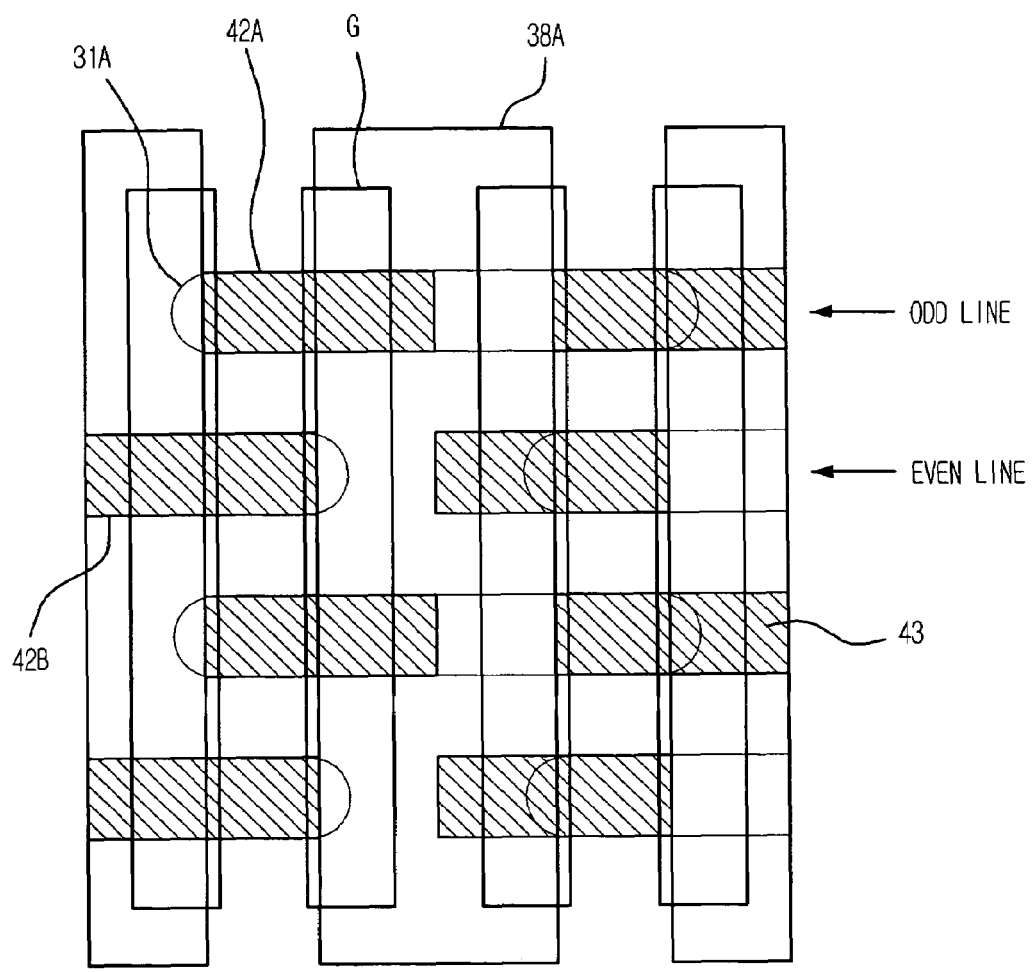

FIGS. 4A to 4C illustrate layout diagrams of the above-described semiconductor device in accordance with an embodiment of the present invention. In FIGS. 4A to 4C, a reference numeral G represents a gate pattern. Specifically, FIG. 4A illustrates a layout of the barrier nitride pattern, FIG. 4B illustrates a layout of the storage node contact hole formed by the SNC mask, and FIG. 4C illustrates a layout of the storage node contact plug.

Particularly, in FIG. 4B, a storage node contact hole 42A of an odd line and a storage node contact hole 42B of an even line have different shapes. That is, the storage node contact hole 42A and the storage node contact hole 42B are offset by a given interval. The storage node 45 and the storage node contact plug 43 are arranged in the same zigzag form so that the bottom of the storage node 45 and the top of the storage node contact plug 43 are maximally overlapped. That is, the storage node contact plug 43 is arranged in a zigzag form, the storage node 45 is arranged in a zigzag form, and the top of the storage node contact plug 43 and the bottom of the storage node 45 are matched such that the storage node contact plug 43 and the storage node 45 are maximally overlapped. This zigzag arrangement can prevent the storage node contact holes from being shorted. Consequently, the adjacent storage nodes having the same layout as the storage node contact hole can be prevented from being shorted.

Although the barrier nitride layer acting as the etch barrier is formed of silicon nitride, SiON can also be used as the barrier nitride layer. SiON is a dielectric layer that has an etch selectivity with respect to the silicon oxide layer but has no conductivity. SiON has an etch selectivity with respect to the silicon oxide layer during both the dry etching process and the wet etching process.

Because the SNC process and the SNC2 process are performed at a time, the fabricating steps can be reduced, attributing to reduction of a fabrication cost. In addition, because there is no interface between the SNC plug and the SNC2 plug, resistance limitation in the interface can be solved and there is no limitation of the SNC2 not-open. Consequently, the reliability of the semiconductor device can be remarkably improved.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising: forming a first insulating layer over a substrate where a landing contact plug is formed;

forming an etch barrier pattern having a line type open region over the first insulating layer;

forming a second insulating layer for planarization over the etch barrier pattern;

forming a contact mask having a hole type open region over the second insulating layer;

performing a self-aligned contact etching process using the etch barrier pattern to etch the second insulating layer disposed under the hole type open region and the first insulating layer disposed under the line type open region to form a contact hole a bottom of which is opened above the landing contact plug;

forming a storage node contact plug in the contact hole; and forming a storage node over the storage node contact plug, wherein the hole type open region has a rectangular hole structure with a major axis and a minor axis, and in the major axis direction, one side of the hole type open region is aligned along one side of the etch barrier pattern and another side of the hole type open region is partially overlapped with the etch barrier pattern.

2. The method of claim 1, wherein the storage node contact plug and the storage node are arranged in an equal zigzag form on a layout.

3. The method of claim 2, wherein a top portion of the storage node contact plug is matched with a bottom portion of the storage node.

4. The method of claim 1, wherein the etch barrier pattern comprises a silicon nitride layer.

5. The method of claim 4, wherein the silicon nitride layer comprises a thermal silicon nitride layer.

6. The method of claim 1, wherein the etch barrier pattern is formed of SiON.

7. The method of claim 1, wherein the etch barrier pattern is formed to a thickness ranging from approximately 300 Å to approximately 500 Å.

8. The method of claim 1, wherein the forming of the contact hole comprises performing a dry etching process using a rich polymer generating gas to selectively etch the first and second insulating layers while having a high etch selectivity with respect to the etch barrier pattern.

9. The method of claim 8, wherein the gas comprises one selected from a group consisting of $C_5F_8$, $C_4F_8$, $C_4F_6$, $CH_2F_2$, and a combination thereof.

10. The method of claim 1, wherein the forming of the contact hole comprises performing a wet etching process to selectively etch the first and second insulating layers while having a high etch selectivity with respect to the etch barrier pattern.

11. The method of claim 10, wherein the wet etching process uses a buffered oxide etchant (BOE).

12. The method of claim 1, wherein the forming of the second insulating layer comprises:
    forming the second insulating layer over the etch barrier pattern; and
    performing an etch-back process to planarize the second insulating layer.

13. The method of claim 12, wherein the second insulating layer comprises one of borophosphosilicate glass (BPSG) and spin on dielectric (SOD).

14. The method of claim 13, wherein an annealing process is additionally performed after the forming of the second insulating layer.

15. The method of claim 1, wherein the second insulating layer is formed to a thickness ranging from approximately 1,000 Å to approximately 1,500 Å.

16. The method of claim 1, wherein a critical dimension of the hole type open region in the major axis is greater than that of the line type open region in the minor axis direction.

* * * * *